United States Patent [19]

Gohl et al.

[11] Patent Number: 4,945,451
[45] Date of Patent: Jul. 31, 1990

[54] PRINTED CIRCUIT WITH THERMAL DRAIN

[75] Inventors: Pierre Gohl, La Colle Sur Loup; Raymond Llabres, Saint Laurent Du Var; Pascal Malgouires, Cannes La Bocca, all of France

[73] Assignee: La Telemecanique Electrique, France

[21] Appl. No.: 254,260

[22] Filed: Sep. 16, 1988

[30] Foreign Application Priority Data

Sep. 16, 1987 [FR] France .............................. 87 12805

[51] Int. Cl.$^5$ ............................................. H05K 7/20
[52] U.S. Cl. ..................................... 361/386; 165/80.3; 165/185; 174/16.3; 357/80; 361/383; 361/388
[58] Field of Search .......................... 165/80.3, 185; 174/16.3; 357/80; 361/383–384, 386–389, 400, 414

[56] References Cited

U.S. PATENT DOCUMENTS

| | | | |
|---|---|---|---|
| 3,222,580 | 12/1965 | Curll, Jr. ............................ | 357/81 |
| 4,254,447 | 3/1981 | Griffis ................................ | 361/389 |
| 4,344,106 | 8/1982 | West et al. ........................ | 361/386 |
| 4,729,061 | 3/1988 | Brown ............................... | 174/16.3 |

FOREIGN PATENT DOCUMENTS 3203609  8/1983  Fed. Rep. of Germany ...... 361/386
2560731  9/1985  France .

Primary Examiner—Gregory D. Thompson
Attorney, Agent, or Firm—William A. Drucker

[57] ABSTRACT

The invention discloses a printed circuit card on which is welded at least an electronic component box as well as a thermal dissipator for dissipating the heat emitted by the component box. The component box and the thermal dissipator are respectively provided with clips and lugs which are engaged and welded in respective holes drilled in the card. A thermal drainage metallic area provided on a zone of the card located under the box forms a thermal adduction path between the box and the lugs of the thermal dissipator. This thermal drainage metallic area is further connected to a clip ensuring a privileged thermal drainage of the electronic component box.

6 Claims, 2 Drawing Sheets ical components presently available on the market, which are positioned on a printed card withstand temperatures higher than the card. It is thus essential to improve the calorific exhaust efficiency permitted by the dissipator and by the thermal path connecting the boxes to this dissipator, if the temperature of the card must be kept lower than a given value, e.g. typically around 105° C.

PRINTED CIRCUIT WITH THERMAL DRAIN

BACKGROUND OF THE INVENTION

1. Field of the Invention

The invention relates to a printed circuit card carrying in particular components boxes positioned and fixed by welding, as well as dissipation means of the heat emitted by the boxes.

Such a card comprises:
a mounting face for the boxes,
a welding face of the boxes,
conductive tracks provided on the mounting face and on the welding face,
holes connecting tracks of the one and the other face, the boxes being provided with connecting clips inserted in the holes, and
a thermal dissipator which is mounted on the card for dissipating the heat emitted by the components boxes.

2. Description of the Prior Art

In order to avoid the problems related to the compensation of backlashes encountered with the dissipators usually mounted directly on the boxes a thermal linking path is provided for connecting the boxes to the dissipator. It is observed in practice that the electronic components presently available on the market, which are positioned on a printed card withstand temperatures higher than the card. It is thus essential to improve the calorific exhaust efficiency permitted by the dissipator and by the thermal path connecting the boxes to this dissipator, if the temperature of the card must be kept lower than a given value, e.g. typically around 105° C.

It is known, according to the French patent No. 2560731 to provide between a component box and the card which carries it, a copper plate constituting a thermal shunt which can extend up to the dissipator. A conduction thermal link is set up between the plate and the box by means of a plastic ceramic strip. The construction of such a cooling system is obviously intricate.

SUMMARY OF THE INVENTION

It is, therefore, an object of this invention to provide an efficient cooling device on a card of the above mentioned type.

It is another object of this invention to simplify the construction process of the cooling device specially without complicating the general manufacture process of the card.

According to the invention, a thermal drainage metallic area is provided on at least one of the card facesin order to collect a part of the heat emitted by each box, this area covering at least a part of the zone of the said face located under the box; the thermal dissipator is constituted by a metallic piece with lugs inserted in the card in close vicinity to the clips of at least one box, the drainage area forming a thermal adduction path between the respective box and the dissipator.

The dissipator which is constituted by a metallic piece with lugs can thus be inserted on the card in the same way as the electronic components and can be welded to the card by the wave passage operation provided for the components welding. It is observed that the construction of the cooling system is thus very simple. In order to reduce the stresses exerted on the card after the wave passage, provision can be made advantageously on a card carrying a multiplicity of boxes of rather than one dissipator, several dissipators each one being associated to one or serveral boxes.

The drainage area may be provided on the mounting face in order to collect the heat radiated by the boxes, the drainage area is then preferably isolated from the box by an air space, thus enabling to avoid the difficulties due to the positioning of the box on this area. The drainage area may also be provided on the welding face. The drainage area extends preferably, on the one hand up to a hole provided for a box clip, assuring preferably a privileged thermal drainage, and on the other hand up to at least a hole provided for one lug of the dissipator.

The drainage area is constituted preferably by a metallic layer obtained one coated with a passivation layer, for instance an insulating varnish, through the same masking, etching and insulation coating operations which enable the achievement of the interconnection tracks. In what concerns the drainage area located on the welding face side, this area has also a sufficiently large surface in order to assure a thermal distribution or homogeneisation function with the aim of avoiding the occurrence of hot spots on the card and it is preferably sufficiently thickened by a tinning layer subsequent to the wave passage of the welding face of the card.

BRIEF DESCRIPTION OF THE DRAWINGS

The invention will be better understood from the following description of a preferred embodiment with reference to the to the drawings in which.

DESCRIPTION OF THE PREFERRED EMBODIMENT

Figure 1:
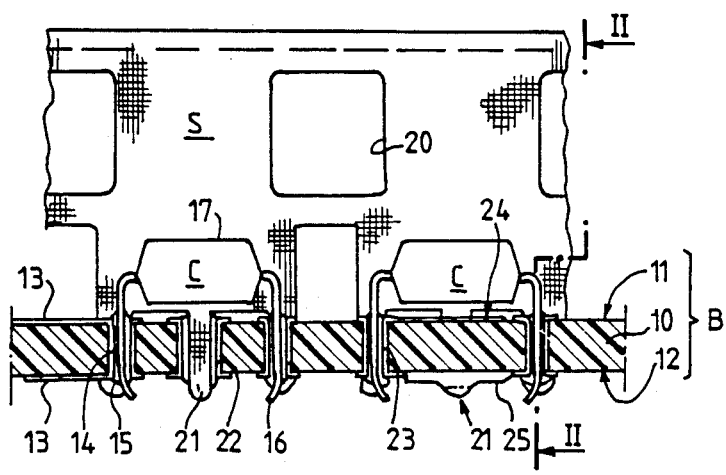
FIG. 1 is a diagrammatic cross-section of a part of a printed circuited card according to the invention.

The printed circuit card B shown on the figures is actually an insulating material plate 10 coated with copper on its two faces, vizus a face 11 for mounting the electronic components C, specially of the dual-in-line package DIL type and a welding face 12 for these components.

The faces 11 and 12 carry interconnection tracks 13, obtained in a conventional way by selective etching of the copper coating. Holes 14 drilled in the card and coated with a metallization 15 are provided for locating connecting clips 16 of the components C boxes 17. These latter are manually or automatically positioned on the card B and are fixed thereto by welding wave V passage under the face 12 (see FIG. 2).

According to the invention, a thermal dissipator S is located on the card and thermally coupled to one or several boxes through at least one thermal drainage metallic area.

The dissipator S is constituted by a metallic piece, for instance in tinned copper, it is an L-shaped piece with openings 20 enabling the passage of the cooling air and with cut-out lugs 21 inserted in holes 22 of the card. The holes 22 are metallization coated 23; they are cylindrical and of a diameter larger than the holes 14 assigned to the clips 16 of the boxes, the lugs 21 having a cross-section larger than that of the clips 16. On the cross-section of FIG. 1, the central lug 21 of the dissipator has been shown to represent the device, although it is shifted forward with respect to the clips 16 as shown on FIG. 2. On the other hand, only one of the clips 16 of the box has been shown on FIG. 2.

Figure 2:
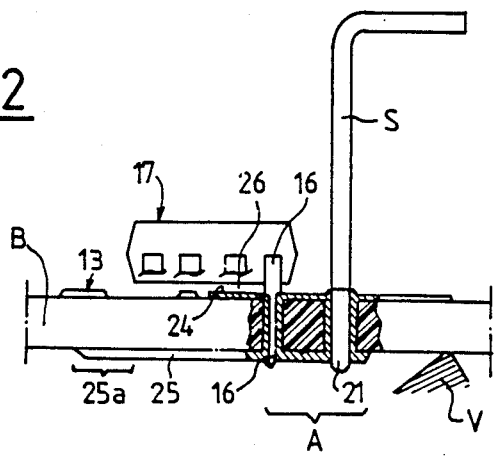
FIG. 2 is a side view, partially in cross-section, along line II—II of FIG. 1.

After being positioned on the card, the dissipator S is fixed thereto by the wave passage V operation, which enables to fix the components C (FIG. 2). Instead of being made of a cut-out piece, the dissipator can be made of a moulded piece.

Figure 4:
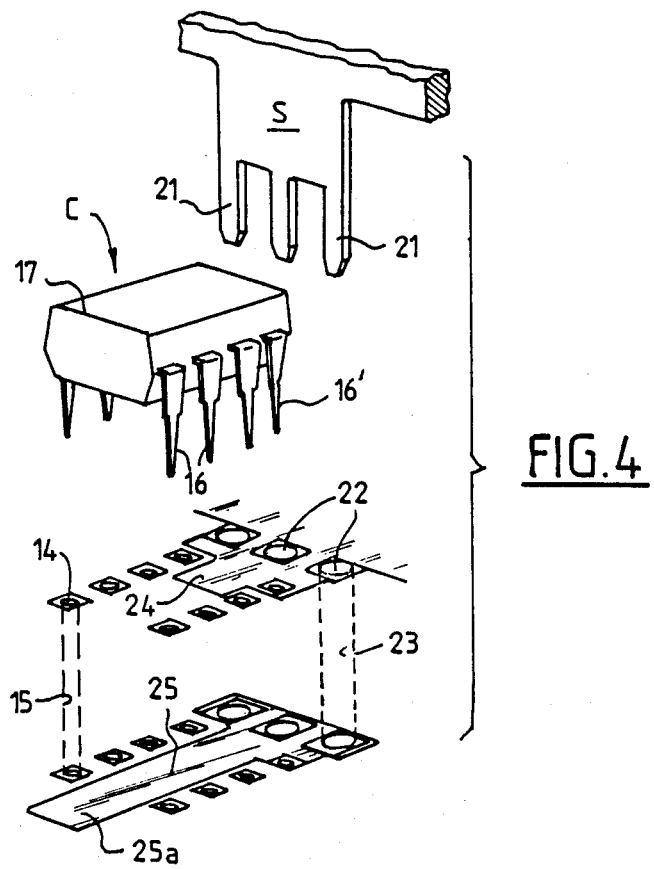
FIG. 4 is an exploded perspective view of the card according to the invention.
Figure 5:
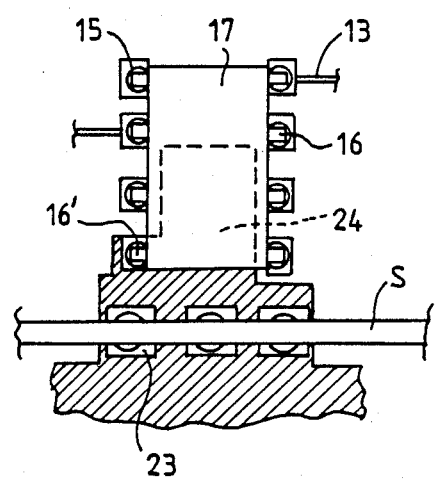
FIGS. 5 and 6 are respectively an upper and lower view of a part of the card in the vicinity of a box.

Two metallic areas 24 and 25 for thermal drainage are respectively located on the mounting face 11 and on the welding face 12 of the card. The area 24 covers a part of the zone of the face 11 underlying the box 17 (see FIGS. 2, 4 and 5) being isolated from the box by an air space 26 (see FIG. 1), in order to collect the heat emitted by the bulge of the box.

Figure 6:
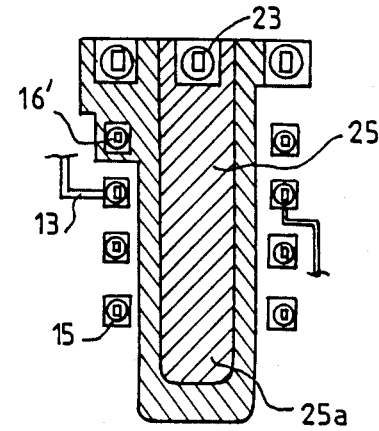

The area 25 covers the zone of the face 12 underlying the box and extends beyond this zone (in 25a, FIGS. 2, 4 and 6) to assure an efficient distribution of the thermal flux on the card surface, in order to avoid the occurrence of hot spots on this latter.

It is noteworthy that at least one clip 16' of the box 17 is linked by conduction, on the one hand to the area 24 and on the other hand, to the area 25. This clip 16' is preferably a privileged thermal dissipation clip of the component, for instance solidly linked to the frame (lead frame) of the chip contained in the box.

Figure 3:
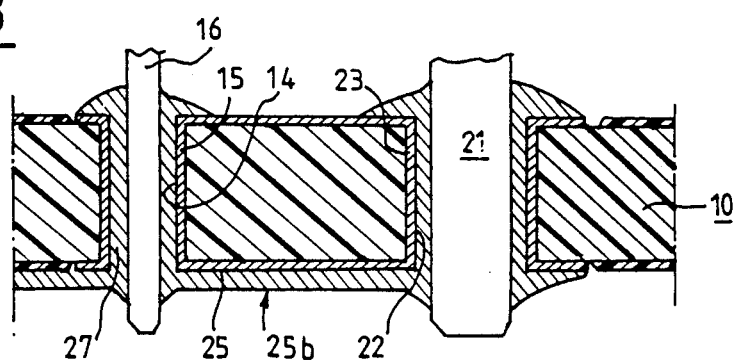
FIG. 3 represents on a larger scale the detail A of FIG. 2.

The connection of the clip 16' with the area 24 is carried out thanks to the welding upward extension 27 which fills the hole 14 and to the metallization 15 thereof being itself in contact with the area 24. The connection of the clip 16'-with the area 25 is carried out by means of the welding 27 and of the metallization 15 which is in contact with the area 25 (see FIG. 3).

The areas 24 and 25 extend up to the metallizations 23 of the holes 22 associated to the lugs 21 of the dissipator S. As shown on FIG. 3, the area 25 is thickened by a metallic layer 25b, specially tin, by wave passage, thus enabling to ascribe thereto a cross-section of sufficient size and to emphasize its function of thermal distribution.

In the present embodiment, the card includes several dissipators S each one being associated to several components C aligned on the card. To each component C correspond three drainage lugs 21 of the dissipator (FIGS. 1 and 4-6). The dissipator lugs 21 are positioned in close vicinity to the clips 16 of the components, being aligned at right angle with the alignment of clips 16.

It must be observed that metallic areas of drain 24, 25 are obtained by masking steps and selective etching steps, then coated with a passivating layer in the course of the process and of passivating coating of the interconnection tracks.

What is claimed is:

1. A printed circuit card carrying at least an electronic component box having connecting clips which are welded on the card, said card presenting a mounting face for the box, a welding face of the box, conducting tracks provided on the mounting face and on the welding face, a first plurality of metallized holes wherein the connecting clips are inserted and welded and a thermal dissipator mounted on the card for dissipating the heat emitted by the box, wherein:

i- a thermal drainage metallic area collecting part of the heating emitted by the box is constituted by a zone of the welding face located under the box which is covered by a thick layer of soldering metal;

ii- the thermal dissipator is a metallic piece having lugs respectively positioned and welded in a second plurality of metallized holes provided on the card in close vicinity to at least one determined connecting clip of said box, said lugs being also welded on said faces of the card;

iii- the thermal drainage metallic area forms a privileged thermal adduction path between said determined connecting clip and the lugs of the thermal dissipator.

2. A printed circuit card as claimed in claim 1, wherein the card carries several boxes and several dissipators are positioned on the card each dissipator being thermally associated with at least one box.

3. A printed circuit as claimed in claim 1, wherein the thermal dissipator presents several lugs thermally associated with the said box.

4. A printed circuit card as claimed in claim 1, wherein the holes of the second plurality have a diameter larger than the holes of the first plurality and the lugs have a cross-section large than that of the connecting clips.

5. A printed circuit card as claimed in claim 1, wherein the lugs are aligned in a first direction and the clips are aligned in a second direction forming a right angle with the first direction.

6. A printed circuit card as claimed in claim 1, wherein the thermal drainage metallic area is located under a zone of the mounting face collecting the heat radiated by the box and being isolated form the box by an air space.

* * * * *

UNITED STATES PATENT AND TRADEMARK OFFICE
CERTIFICATE OF CORRECTION

PATENT NO. : 4,945,451

DATED : July 31, 1990

INVENTOR(S) : Pierre Cohl et al.

It is certified that error appears in the above-identified patent and that said Letters Patent is hereby corrected as shown below:

ON THE TITLE PAGE   Item 21, "254,260" should be --245,260--.

Signed and Sealed this

Thirty-first Day of December, 1991

Attest:

HARRY F. MANBECK, JR.

Attesting Officer        Commissioner of Patents and Trademarks